US012707906B2

(12) United States Patent
Pearlstein et al.

(10) Patent No.: US 12,707,906 B2
(45) Date of Patent: Aug. 11, 2026

(54) SELECTIVE THERMAL ATOMIC LAYER DEPOSITION

(71) Applicant: VERSUM MATERIALS US, LLC, Tempe, AZ (US)

(72) Inventors: Ronald M. Pearlstein, San Marcos, CA (US); Xinjian Lei, Vista, CA (US); Robert Gordon Ridgeway, Chandler, AZ (US); Aiping Wu, Chandler, AZ (US); Yi-Chia Lee, Chupei (TW); Sumit Agarwal, Arvada, CO (US); Rohit Narayanan Kavassery Ramesh, Golden, CO (US); Wanxing Xu, Golden, CO (US); Ryan James Gasvoda, Golden, CO (US)

(73) Assignee: Versum Materials US, LLC, Tempe, AZ (US)

( * ) Notice: Subject to any disclaimer, the term of this patent is extended or adjusted under 35 U.S.C. 154(b) by 401 days.

(21) Appl. No.: 18/254,467

(22) PCT Filed: Nov. 30, 2021

(86) PCT No.: PCT/US2021/061286

§ 371 (c)(1),
(2) Date: May 25, 2023

(87) PCT Pub. No.: WO2022/119860

PCT Pub. Date: Jun. 9, 2022

(65) Prior Publication Data

US 2024/0047196 A1 Feb. 8, 2024

Related U.S. Application Data

(60) Provisional application No. 63/120,086, filed on Dec. 1, 2020, provisional application No. 63/182,581, filed on Apr. 30, 2021.

(51) Int. Cl.
*C23C 16/02* (2006.01)
*C23C 16/04* (2006.01)
*C23C 16/455* (2006.01)
*H10P 14/60* (2026.01)
*H10P 14/692* (2026.01)

(52) U.S. Cl.
CPC ...... *H10P 14/6339* (2026.01); *C23C 16/0254* (2013.01); *C23C 16/04* (2013.01); *C23C 16/45525* (2013.01); *H10P 14/6336* (2026.01); *H10P 14/69215* (2026.01); *H10P 14/6922* (2026.01); *H10P 14/6927* (2026.01)

(58) Field of Classification Search
CPC ................ C23C 16/0254; C23C 16/04; C23C 16/45525
See application file for complete search history.

(56) References Cited

U.S. PATENT DOCUMENTS

| | | | |
|---|---|---|---|
| 9,816,180 B2 | 11/2017 | Haukka et al. | |
| 10,043,656 B1 | 8/2018 | Smith et al. | |
| 10,460,930 B2 * | 10/2019 | Hausmann | C23C 16/04 |
| 10,900,120 B2 * | 1/2021 | Sharma | C23C 16/0272 |
| 11,060,188 B2 * | 7/2021 | Yu | C23C 16/403 |
| 11,282,710 B2 * | 3/2022 | Pearlstein | H10P 95/00 |
| 2015/0299848 A1 | 10/2015 | Haukka et al. | |
| 2017/0037513 A1 | 2/2017 | Haukka et al. | |
| 2018/0211833 A1 | 7/2018 | Li et al. | |
| 2018/0233349 A1 | 8/2018 | Smith et al. | |
| 2018/0240674 A1 * | 8/2018 | Bilodeau | H01L 21/28255 |
| 2018/0261448 A1 * | 9/2018 | Smith | H01L 21/3105 |
| 2018/0323055 A1 | 11/2018 | Woodruff et al. | |
| 2018/0342388 A1 | 11/2018 | Chakraborty et al. | |
| 2019/0157076 A1 * | 5/2019 | Hausmann | C23C 16/50 |

(Continued)

FOREIGN PATENT DOCUMENTS

| | | | | |
|---|---|---|---|---|
| CN | 106611702 | * | 5/2017 | H01L 21/205 |
| KR | 10-2018-0045040 | * | 5/2018 | H01L 21/02 |

(Continued)

OTHER PUBLICATIONS

Mameli, Alfredo, et al., "Area-Selective Atomic Layer Deposition of SiO2 Using Acetylacetone as a Chemoselective Inhibitor in an ABC-Type Cycle". ACS Nano 2017, 11, 9303-9311.*
Mackus, Adriaan J., et al., "From the Bottom-Up: Toward Area-Selective Atomic Layer Deposition with High Selectivity". Chemistry of Materials, 2019, 31, 2-12.*
Chen, Rong, et al., "Achieving area-selective atomic layer deposition on patterned substrates by selective surface modification". Applied Physics Letters 86, 191910 (2005), pp. 1-3.*

(Continued)

*Primary Examiner* — Bret P Chen
(74) *Attorney, Agent, or Firm* — Versum Materials US, LLC; Daniel Roth

(57) ABSTRACT

A selective thermal atomic layer deposition (ALD) process is disclosed. The process may comprise loading a substrate comprising a dielectric material, and a metal, into a reactor. The substrate may be reacted with a non-plasma based oxidant, thereby forming an oxidized metal surface on the metal. The substrate may be heated and exposed to a passivation agent that adsorbs more onto the oxidized metal than the dielectric material. Such exposure may form a passivation layer on the oxidized metal surface, and the substrate may be exposed to a silicon precursor that adsorbs more onto the dielectric material than the passivation layer, forming a chemi-adsorbed silicon-containing layer on the dielectric material. The substrate may be exposed to the non-plasma based oxidant, that simultaneously partially oxidizes the passivation layer, and oxidizes the chemi-adsorbed silicon-containing layer to form a silicon-containing dielectric film on the dielectric material.

20 Claims, 3 Drawing Sheets

(56) References Cited

U.S. PATENT DOCUMENTS

2019/0393024 A1 * 12/2019 Kim ........................ H10P 70/23
2020/0090924 A1 3/2020 Wu et al.

FOREIGN PATENT DOCUMENTS

WO WO 2018/213018 * 11/2018 ............. C23C 16/30
WO 2019/023001 A1 1/2019

OTHER PUBLICATIONS

Loepp, G., et al. (1999). "Adsorption of Heptanethiol on Cu (110)" Langmuir 15 (11): 3767-3772.

* cited by examiner

SELECTIVE THERMAL ATOMIC LAYER DEPOSITION

CROSS-REFERENCE TO RELATED APPLICATIONS

This application for patent is a National Stage filing under 35 U.S.C. 371 of International Application No. PCT/2021/061286 filed Dec. 1, 2021, which claims priority to US patent application having Ser. No. 63/120,086, filed on Dec. 1, 2020, and US patent application having Ser. No. 63/182,581, filed on Apr. 30, 2021.

TECHNICAL FIELD

This disclosure generally relates selective atomic layer deposition (ALD), and more particularly to selective thermal ALD.

BACKGROUND

U.S. Pat. No. 9,816,180 discloses methods for selectively depositing onto a surface of a substrate relative to a second, different surface. An exemplary deposition method can include selectively depositing a material, such as a material comprising nickel, nickel nitride, cobalt, iron, and/or titanium oxide on a first surface, such as a $SiO_2$ surface, relative to a second, different surface, such as a H-terminated surface, of the same substrate. Methods can include treating a surface of the substrate to provide H-terminations prior to deposition.

US Patent Application Publication US 2018/0342388 discloses methods of selectively depositing organic and hybrid organic/inorganic layers. More particularly, embodiments of the disclosure are directed to methods of modifying hydroxyl terminated surfaces for selective deposition of molecular layer organic and hybrid organic/inorganic films. Additional embodiments of the disclosure relate to cyclic compounds for use in molecular layer deposition processes.

US Patent Application Publication US 2017/0037513 discloses methods for selectively depositing a material on a first metal or metallic surface of a substrate relative to a second, dielectric. surface of the substrate, or for selectively depositing metal oxides on a first metal oxide surface of a substrate relative to a second silicon oxide surface. The selectively deposited material can be, for example, a metal, metal oxide, metal nitride, metal silicide, metal carbide and/or dielectric material. In some embodiments a substrate comprising a first metal or metallic surface and a second dielectric surface is alternately and sequentially contacted with a first vapor-phase metal halide reactant and a second reactant. In some embodiments a substrate comprising a first metal oxide surface and a second silicon oxide surface is alternately and sequentially contacted with a first vapor phase metal fluoride or chloride reactant and water.

U.S. Pat. No. 10,460,930 discloses methods and apparatuses for selectively depositing silicon oxide on a dielectric surface relative to a metal-containing surface such as copper. Methods involve exposing a substrate having dielectric and copper surfaces to a copper-blocking reagent such as an alkyl thiol to selectively adsorb to the copper surface, exposing the substrate to a silicon-containing precursor for depositing silicon oxide, exposing the substrate to a weak oxidant gas and igniting a plasma to convert the adsorbed silicon-containing precursor to form silicon oxide, and exposing the substrate to a reducing agent to reduce exposure of any oxidized copper to the weak oxidant gas.

US Patent Application Publication US 2018/0211833 discloses processing platforms having a central transfer station with a robot and an environment having greater than or equal to about 0.1% by wt. water vapor, a pre-clean chamber connected to a side of the transfer station and a batch processing chamber connected to a side of the transfer station. The processing platform is configured to pre-clean a substrate to remove native oxides from a first surface, form a blocking layer using an alkylsilane and selectively deposit a film. Methods of using the processing platforms and processing a plurality of wafers are also described.

World Intellectual Property Organization Application Publication WO 2019/023001 discloses methods of selectively depositing a film on a hydroxide terminated surface relative to a hydrogen terminated surface. The hydrogen terminated surface is exposed to a nitriding agent to form an amine terminated surface which is exposed to a blocking molecule. to form a blocking layer on the surface. A film can then be selectively deposited on the hydroxide terminated surface.

US Patent Application Publication US 2018/0233349 discloses methods and apparatuses for selectively depositing silicon oxide on a silicon oxide surface relative to a silicon nitride surface. Methods involve pre-treating a substrate surface using ammonia and/or nitrogen plasma and selectively depositing silicon oxide on a silicon oxide surface using alternating pulses of an aminosilane silicon precursor and an oxidizing agent in a thermal atomic layer deposition reaction without depositing silicon oxide on an exposed silicon nitride surface.

U.S. Pat. No. 10,043,656 discloses methods and apparatuses for selectively depositing silicon-containing dielectric or metal containing dielectric material on silicon or metal surfaces selective to silicon oxide or silicon nitride materials. Methods involve exposing the substrate to an acyl chloride which is reactive with the silicon oxide or silicon nitride material where deposition is not desired to form a ketone structure that blocks deposition on the silicon oxide or silicon nitride material. Exposure to the acyl chloride is performed prior to deposition of the desired silicon-containing dielectric material or metal-containing dielectric material.

US Patent Application Publication US 2018/0323055 discloses a method for selectively forming a silicon nitride film on a substrate comprising a first metallic surface and a second dielectric surface by a cyclical deposition process. The method may comprise contacting the substrate with a first reactant comprising a silicon halide source and contacting the substrate with a second reactant comprising a nitrogen source, wherein the incubation period for the first metallic surface is less than the incubation period for the second dielectric surface. Semiconductor device structures comprising a selective silicon nitride film are also disclosed.

US Patent Application Publication US 2020/0090924 discloses methods of depositing a metal oxide film on a metal layer relative to a dielectric layer by exposing a substrate to an organometallic precursor followed by exposure to an oxidant.

Loepp, G., et al. (1999). "Adsorption of Heptanethiol on Cu (110)" Langmuir 15 (11): 3767-3772 discloses the adsorption kinetics of heptanethiol [CH 3 $(CH_2)_6$ SH] on Cu(110) and the ordering of monolayer films prepared by ultrahigh vacuum vapor deposition have been studied by means of thermal-desorption spectroscopy, XPS, LEED, and scanning tunneling microscopy.

There is a need in the art to provide a method of deposition of silicon dielectric materials, such as silicon oxide, carbon doped silicon oxide, and carbon doped silicon oxynitride, selectively on top of a dielectric surface relative to a metal surface by a thermal atomic layer deposition semiconductor manufacturing process without using a plasma.

SUMMARY OF THE INVENTION

In accordance with a first aspect of the present disclosure, a selective thermal atomic layer deposition (ALD) process is disclosed. In this first aspect of the invention disclosed herein, a surface of a metal on a substrate may not be oxidized, and therefore require an oxidation step to better enable the metal to interact with a passivation agent. As such, this method may include (a) loading the substrate comprising a dielectric material, and the metal into a reactor. The substrate may be (b) reacted with a non-plasma based oxidant, thereby forming an oxidized metal surface on the metal. The substrate may be (c) heated to a temperature less than, or equal to, 150° C., and then (d) exposed to a passivation agent that preferentially adsorbs more onto the oxidized metal surface than the dielectric material, thereby forming a passivation layer on the oxidized metal surface. Next, the substrate may be (e) exposed to a silicon precursor that preferentially adsorbs more onto the dielectric material than the passivation layer, thereby forming a chemi-adsorbed silicon-containing layer on the dielectric material. Finally, the substrate may then be (f) exposed to the non-plasma based oxidant again, and this exposure simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material.

In accordance with a second aspect of the invention, an additional selective thermal atomic layer deposition (ALD) process is disclosed. The second method may include (g) loading the substrate comprising a dielectric material, and metal having a native metal oxide surface into a reactor. The substrate may be (h) heated to a temperature less than, or equal to, 150° C., and then (i) exposed to a passivation agent that preferentially adsorbs more onto the native metal oxide surface than the dielectric material, thereby forming a passivation layer on the native metal oxide surface. Next, the substrate may be (j) exposed to a silicon precursor that preferentially adsorbs more onto the dielectric material than the passivation layer on the native metal oxide surface, thereby forming a chemi-adsorbed silicon-containing layer on the dielectric material. Then, the substrate may be (k) exposed to a non-plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material.

DETAILED DESCRIPTION

Figure 1:
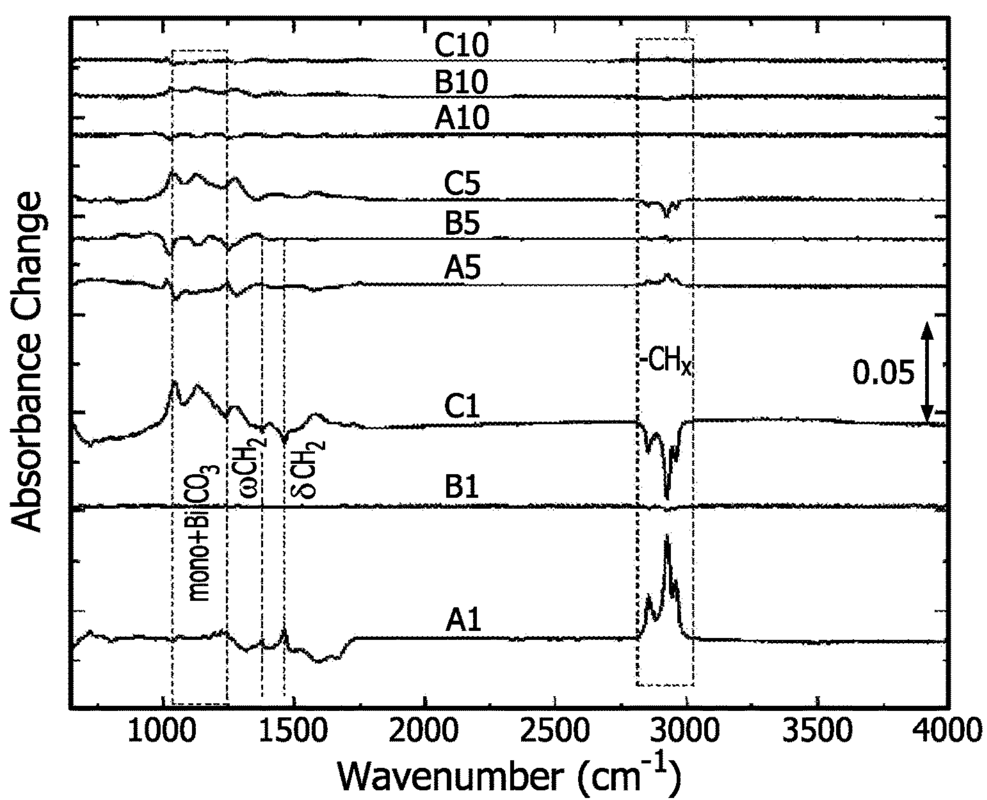
FIG. 1 shows infrared absorbance change during A-B-C type ALD process for the $1^{st}$, $5^{th}$, and $10^{th}$ cycles wherein A=1-heptanethiol (HTT), B=di-sec-butylaminosilane (DSBAS), C=$O_3$ at 100° C. as described in Working Example 2. The selectivity is retained during these 10 cycles.
Figure 1:
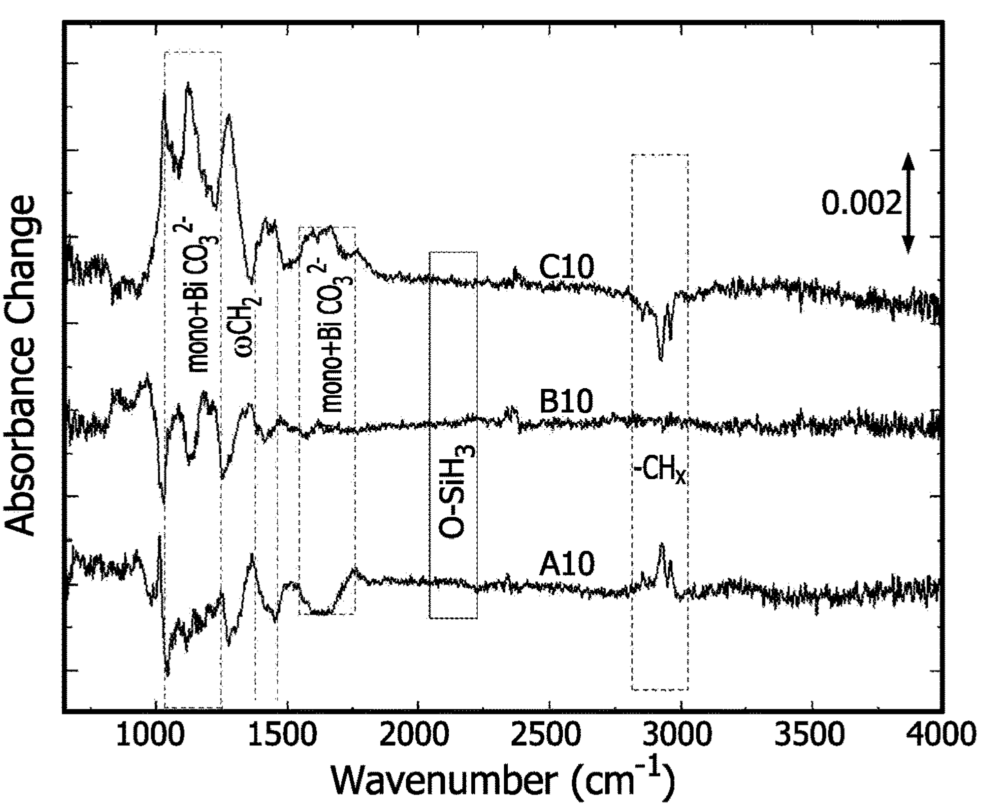
Figure 2:
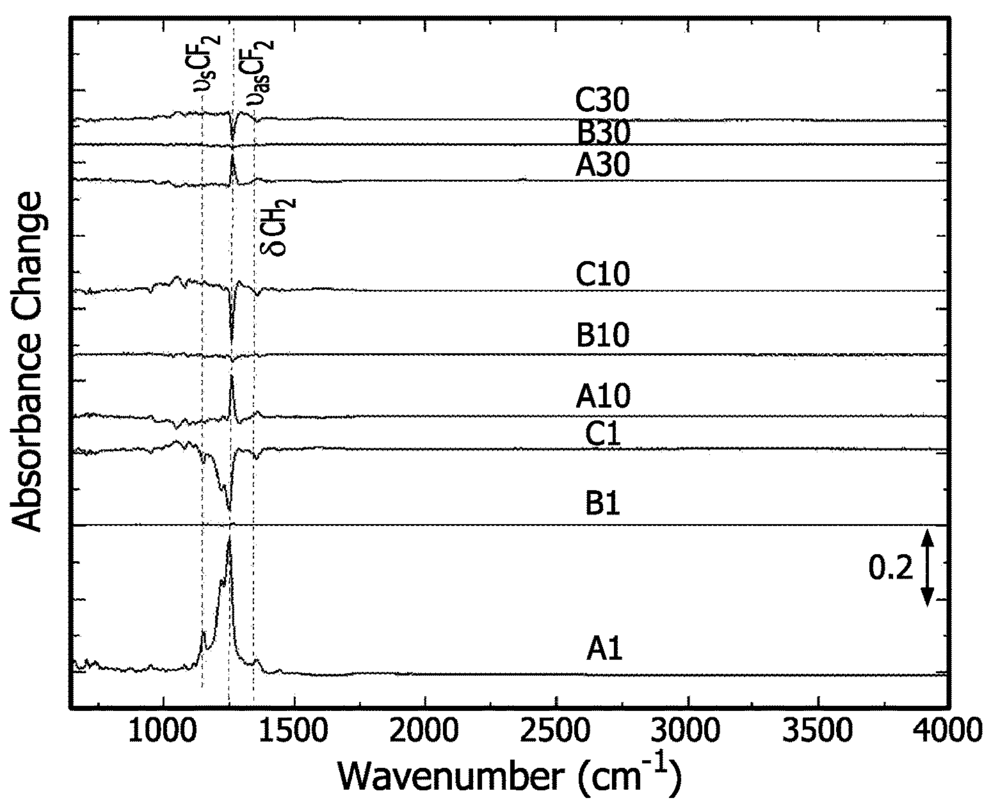
FIG. 2 shows infrared absorbance change during A-B-C type ALD process for the Pt, $10^{th}$, and $30^{th}$ cycles wherein A=1H,1H,2H,2H-Perfluorodecanethiol (PFDT), B=DSBAS, C=$O_3$ at 100° C. as described in Working Example 3. The selectivity is retained during these 30 cycles.
Figure 2:
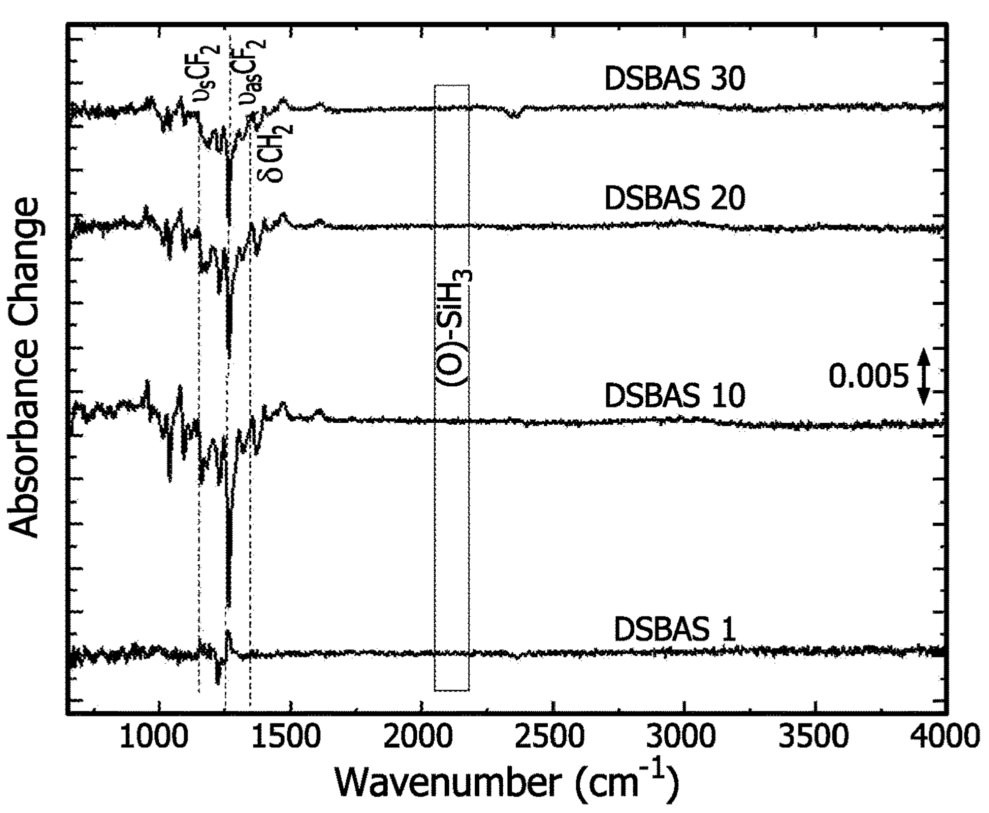

Various aspects of the disclosure will now be described with reference to the drawings and tables disclosed herein, if applicable, with like reference numbers referring to like elements, unless specified otherwise. As described above, a need exists in the art to deposit silicon-containing dielectric materials, such as silicon oxide, carbon doped silicon oxide, and carbon doped silicon oxynitride, selectively on top of a dielectric surface relative to a metal surface in a semiconductor manufacturing process using a thermal process without using a plasma. As such, the Applicant researched means to achieve the above.

Accordingly, disclosed herein in a first aspect of the invention, is a novel, and non-obvious, selective thermal atomic layer deposition (ALD) process, that selectively deposits silicon dielectric materials on top of a dielectric material relative to a metal, in an ALD reactor. In this first aspect of the invention disclosed herein, a surface of a metal on a substrate may not be oxidized, and therefore require an oxidation step to better enable the metal to interact with a passivation agent. As such, this method may include (a) loading the substrate comprising a dielectric material, and the metal into a reactor. The substrate may be (b) reacted with a non-plasma based oxidant, thereby forming an oxidized metal surface on the metal. The substrate may be (c) heated to a temperature less than, or equal to, 150° C., and then (d) exposed to a passivation agent that preferentially adsorbs more onto the oxidized metal surface than the dielectric material, thereby forming a passivation layer on the oxidized metal surface. Next, the substrate may be (e) exposed to a silicon precursor that preferentially adsorbs more onto the dielectric material than the passivation layer, thereby forming a chemi-adsorbed silicon-containing layer on the dielectric material. Finally, the substrate may then be (f) exposed to the non-plasma based oxidant again, and this exposure simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. In a preferred embodiment of this method, the dielectric material may be selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials. The metal in a preferred embodiment may be selected from selected from the group consisting of cobalt, aluminum, copper, tantalum, ruthenium, molybdenum, tungsten, platinum, iridium, nickel, titanium, silver, gold, or a combination thereof.

Additionally, the non-plasma based oxidant may be selected from the group consisting of hydrogen peroxide (gaseous), oxygen, and ozone, in the preferred embodiment of this method. More particularly, however, in the preferred embodiment, step (b), the reacting the substrate with a non-plasma based oxidant, thereby forming an oxidized metal surface on the metal step, occurs at a temperature less than, or equal to, 500° C. In a more preferred embodiment, step (b), the reacting the substrate with a non-plasma based oxidant, thereby forming an oxidized metal surface on the metal step, occurs at a temperature less than, or equal to, 150° C. In additional embodiments, step (b), the reacting the substrate with a non-plasma based oxidant, thereby forming an oxidized metal surface on the metal step, occurs at a temperature less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

As described above, the substrate may be independently heated to less than, or equal to, 150° C., in step (c). In additional embodiments of this method, the substrate in step (c) may be heated to a temperature of less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

Moving on, in one alternative of a preferred embodiment of this method, the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol. In another alternative of this method, the passivation agent is selected from the group consisting of di-tert-butyl disulfide, and di-heptane disulfide. In a further alternative of a preferred embodiment of this method, the passivation agent may be selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

In a preferred embodiment, the passivation layer may comprise a monolayer of the passivation agent adsorbed to the oxidized metal surface. More specifically, the monolayer of the passivation agent may be chemi-adsorbed to the oxidized metal surface. In an additional aspect of the preferred embodiment, the passivation layer may further comprise a second layer of the passivation agent that is physi-adsorbed to the monolayer of the passivation agent that is chemi-adsorbed to the metal surface.

In a preferred embodiment of this aspect of the invention, the silicon precursor may be an organoaminomonsilane selected from the group consisting of di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, bis(cyclohexylamino)dimethylsilane, and combinations thereof.

Alternatively, the silicon precursor may be an organoaminodisilane selected from the group consisting of di-iso-propylaminodisilane, and di-sec-butylaminodisilane in the preferred embodiment in this aspect of the invention. Further, in an additional alternative of this preferred embodiment of the method, the silicon precursor may be an organoaminotrisilylamine selected from the group consisting of di-iso-propylaminotrisilylamine, diethylaminotrisilylamine, iso-propylaminotrisilylamine, and cyclohexylmethylaminotrisilylamine.

In an additional alternative to the preferred embodiment of the method disclosed herein, the silicon precursor may be an organoaminocyclosiloxane selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,6,8-tetramethylcyclotetrasiloxane, and 2-cyclohexylmethylamino-2,4,6,8-tetramethylcyclotetrasiloxane.

Additionally, in a preferred embodiment of the method, the dielectric film may have a thickness, and the thickness required may be a predetermined value. For example, in order to meet performance requirements, the film thickness may need to be: greater than, or equal to, 5 nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this method may include repeating steps (d) through (f) until the thickness of the dielectric film formed on the dielectric material reaches the predetermined value. In an alternative of this portion of the process, the substrate may not need to be exposed to the passivation agent between exposures to the silicon precursor that preferentially adsorbs more onto the dielectric material than the passivation layer. As such, in some instances wherein the dielectric film has a thickness, the preferred embodiment of this method only includes repeating steps (e) through (f), not steps (d) through (f), until the thickness of dielectric film formed on the dielectric material reaches the predetermined value.

Accordingly, each exposure in steps (d) through (f) may create a known thickness of the silicon-containing dielectric film. For example, each cycle of steps (d) through (f) may hypothetically create a silicon-containing dielectric film approximately 10 nanometers thick. Further, film property testing may have determined that such film requires a thickness of approximately 40 nanometers to create the film properties sought, and steps (d) through (f) would need to be repeated for four cycles to create a film approximately 40 nanometers thick. As such, in another alternative of the preferred embodiment of this method, steps (d) through (f) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In an alternative of this portion of the process, the substrate may not need to be exposed to the passivation agent between exposures to the silicon precursor that preferentially adsorbs more onto the dielectric material than the passivation layer. As such, in some instances wherein the dielectric film has a thickness, the preferred embodiment of this method only includes repeating steps (e) through (f), not steps (d) through (f), for the predetermined number of cycles.

In an additional limitation to the preferred embodiment of this method disclosed herein, the reactor may be purged between steps. For example, in one embodiment the reactor may be purged between steps (d) and (e). In another instance, the reactor may be purged between the steps (e) and (f). In a further embodiment, the reactor may be purged between steps (d) and (e), as well as between steps (e) and (f). The reactor purge between any of the steps described above may be selected from the group consisting of flushing the reactor with an inert gas, and exposing the reactor to a vacuum source. Example inert gases that may be utilized include, but are not limited to, helium, argon, and nitrogen.

Selective Thermal Deposition of Dielectric Materials Manufactured in Accordance with the First Aspect of the Invention Disclosed Herein Working Example 1—$O_3$ as the Non-plasma Based Oxidant, Heptanethiol (HTT) as the Passivation Agent, and di-sec-butylaminosilane (DSBAS), or 2-dimethylamino-2,4,6,8-tetramethylcyclotetrasiloxane, as the Silicon Precursor.

Silicon wafer substrates with electroplated copper on their surface that was planarized by chemical mechanical planarization were placed in a vacuum chamber. The substrate was heated to 100° C. and treated with 7% ozone gas in oxygen for 10 minutes with a total pressure of 5 Ton (667 Pa) to oxidize the surface and remove organic contamination and then the chamber was evacuated. The substrate was then heated to 150° C. and a protective film of a passivation agent was deposited by introducing heptanethiol vapor at a pressure of 0.38 Ton (50 Pa) for 130 seconds followed by an argon purge for 60 seconds to remove unreacted thiol. The substrate was then treated with di-sec-butylaminosilane vapor at 0.35 Torr (47 Pa) for 57 s at 150° C. followed by argon purge for 60 seconds. The substrate was then exposed to 7% ozone at 5 Torr (667 Pa) for 30 s while maintaining the temperature at 150° C. followed by a 30 seconds of argon purge. The process was repeated multiple times from step 2) for up to ten times, and no evidence of silicon oxide deposition on the copper surface was observed based on reflection-absorption infrared spectroscopy or X-ray photoelectron spectroscopy. There is no evidence of damage or roughening of the copper surface.

As noted above, in the first aspect of the invention disclosed herein, the surface of the metal on the substrate may not be oxidized, and therefore requires an oxidation step to better enable the metal to interact with the passivation agent. In other instances, the surface of the metal on the substrate may be sufficiently oxidized for it to better interact with the passivation agent. For example, the surface of the metal may be a native oxide. As such, in a second aspect of this disclosure, another novel, and non-obvious, selective thermal atomic layer deposition (ALD) process that selectively deposits silicon dielectric materials on top of a dielectric material, relative to a metal, in an ALD reactor is disclosed.

More specifically, this second method may include (g) loading the substrate comprising a dielectric material, and metal having a native metal oxide surface into a reactor. The substrate may be (h) heated to a temperature less than, or equal to, 150° C., and then (i) exposed to a passivation agent that preferentially adsorbs more onto the native metal oxide surface than the dielectric material, thereby forming a passivation layer on the native metal oxide surface. Next, the substrate may be (j) exposed to a silicon precursor that preferentially adsorbs more onto the dielectric material than the passivation layer on the native metal oxide surface, thereby forming a chemi-adsorbed silicon-containing layer on the dielectric material. Then, the substrate may be (k) exposed to a non-plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. In a preferred embodiment of the second method, the dielectric material may be selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials. The metal in this preferred embodiment may be selected from selected from the group consisting of cobalt, aluminum, copper, tantalum, ruthenium, molybdenum, tungsten, platinum, iridium, nickel, titanium, silver, gold, or a combination thereof.

The non-plasma based oxidant used in the second aspect of this disclosure may be selected from the group consisting of hydrogen peroxide (gaseous), oxygen, and ozone. In an even more preferred embodiment, step (b), the reacting the substrate with a non-plasma based oxidant, thereby forming an oxidized metal surface on the metal step, occurs at a temperature less than, or equal to, 150° C.

As described above, the substrate may be heated to less than, or equal to, 150° C., in step (h). In additional embodiments of the second method disclosed herein, the substrate in step (h) may be heated to a temperature of less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

Moving on, in one alternative of the preferred embodiment of this method, the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol. In another alternative of this method, the passivation agent is selected from the group consisting of di-tert-butyl disulfide, and di-heptane disulfide. In a further alternative of the preferred embodiment of this method, the passivation agent may be selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

In a preferred embodiment of the second method disclosed herein, the passivation layer may comprise a monolayer of the passivation agent adsorbed to the native metal oxide metal surface. More specifically, the monolayer of the passivation agent may be chemi-adsorbed to the native metal oxide surface. In an additional aspect of the preferred embodiment, the passivation layer may further comprise a second layer of the passivation agent that is physi-adsorbed to the monolayer of the passivation agent that is chemi-adsorbed to the native metal oxide surface.

In a preferred embodiment of the second aspect of the invention, the silicon precursor may be an organoaminomonsilane selected from the group consisting of di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, bis(cyclohexylamino)dimethylsilane, and combinations thereof.

Alternatively, the silicon precursor may be an organoaminodisilane selected from the group consisting of di-iso-propylaminodisilane, and di-sec-butylaminodisilane in the preferred embodiment in the second aspect of the invention. Further, in an additional alternative of this embodiment of the second method, the silicon precursor may be an organoaminotrisilylamine selected from the group consisting of di-iso-propylaminotrisilylamine, diethylaminotrisilylamine, iso-propylaminotrisilylamine, and cyclohexylmethylaminotrisilylamine.

In an additional alternative to the second method disclosed herein, the silicon precursor may be an organoaminocyclosiloxane selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,6,8-tetramethylcyclotetrasiloxane, and 2-cyclohexylmethylamino-2,4,6,8-tetramethylcyclotetrasiloxane.

Additionally, in a preferred embodiment of the second method, the dielectric film may have a thickness, and the thickness required may be a predetermined value. For example, in order to meet performance requirements, the film thickness may need to be: greater than, or equal to, 5 nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this second method may include repeating steps (i) through (k) until the thickness of the dielectric film formed on the dielectric material reaches the predetermined value. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the non-plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

Alternatively, each exposure in steps (i) through (k) may create a known thickness of the dielectric film. For example, each cycle of steps (i) through (k) may hypothetically create a silicon-containing dielectric film approximately 10 nanometers thick. Further, film property testing may have determined that such film requires a thickness of approximately 40 nanometers to create the film properties sought, and steps (i) through (k) would need to be repeated for four cycles to create a film approximately 40 nanometers thick. As such, in an alternative of this second method, steps (i) through (k) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the non-plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

Additionally, in another alternative of the second method, the dielectric film may have a thickness, and the thickness required may be a predetermined value. For example, as described before, in order to meet performance requirements, the film thickness may need to be: greater than, or equal to, 5 nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this second method may include repeating steps (j) through (k) until the thickness of the dielectric film formed on the dielectric material reaches the predetermined value. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the non-plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the silicon-containing dielectric material, thereby forming a silicon-containing dielectric film on the dielectric material.

Furthermore, and alternatively, each exposure in steps (j) through (k) may create a known thickness of the dielectric film. For example, each cycle of steps (j) through (k) may hypothetically create a silicon-containing dielectric film approximately 10 nanometers thick. Further, film property testing may have determined that such film requires a thickness of approximately 40 nanometers to create the film properties sought, and steps (j) through (k) would need to be repeated for four cycles to create a film approximately 40 nanometers thick. As such, in an alternative of this second method, steps (j) through (k) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the non-plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

In an additional limitation to the preferred embodiment of the second method disclosed herein, the reactor may be purged between steps. For example, in one embodiment the reactor may be purged between steps (i) and (j). In another instance, the reactor may be purged between the steps (j) and (k). In a further embodiment, the reactor may be purged between steps (i) and (j), as well as between steps (j) and (k). The reactor purge between any of the steps described above may be selected from the group consisting of flushing the reactor with an inert gas, and exposing the reactor to a vacuum source. Some inert gases that may be utilized include, but are not limited to, helium, argon, and nitrogen.

Selective Thermal Deposition of Dielectric Materials Manufactured in Accordance with the Second Aspect of the Invention Disclosed Herein Working Example 2—A-B-C type ALD process using HTT as the blocking molecule, $O_3$ as the oxygen source, and di-sec-butylaminosilane (DSBAS) or 2-dimethylamino-2,4,6,8-tetramethylcyclotetrasiloxane as the Si precursors.

Silicon wafer substrates with electroplated copper on their surface that was planarized by CMP or with a native oxide surface was placed in a vacuum chamber evacuated to a base pressure of $5\times10^{-6}$ Ton. The substrate was heated to 100° C. and a protective layer of HTT was selectively attached on the CMP Cu substrates via the vapor phase at a HTT pressure of 0.38 Ton (50 Pa) for 130 s followed by an Ar purge for 60 s to remove the unreacted thiol. HTT functionalized Cu substrate was exposed to DSBAS vapor at 0.035 Torr (5 Pa) for 57 s or 2-dimethylamino-2,4,6,8-tetramethylcyclotetrasiloxane vapor at 0.050 Ton (7 Pa) for 20 s followed by a 60 s Ar purge to remove any unreacted Si precursor. The substrate was then exposed to 7% $O_3$ in $O_2$ (by weight) at a total pressure of 2 Ton (267 Pa) for 30 s followed by a 30 s Ar purge step to complete one cycle of the $SiO_2$ ALD process. Steps 1 through 3 were repeated in an A-B-C type ALD (A=HTT, B=DSBAS or 2-dimethylamino-2,4,6,8-tetramethylcyclotetrasiloxane, C═$O_3$) process up to ten times. No evidence of $SiO_2$ deposition on the Cu surface was observed based on results from reflection-absorption infrared spectroscopy (RAIRS) and XPS. During the $O_3$ partial cycle, partial combustion of the heptanethiol leads to $CO_3^{2-}$ formation on the Cu surface. These $CO_3^{2-}$ species are reactive sites for reattachment of the heptanethiol in subsequent cycles. Using in situ RAIRS and high resolution XPS we confirm no of O—$SiH_3$ species on copper until the $45^{th}$ cycle. We also indicate that ABC type process on the $SiO_2$ surface deposited 5 nm of $SiO_2$ indicating selective growth. Though HT was successful in inhibiting the $SiO_2$ ALD process, high resolution XPS studies of the Cu 2p region showed copper in the oxidized state. Further we showed using RAIRS that the blocking ability of HT did not sustain when the process temperature was changed to 150° C. Characterization of surface morphology with AFM revealed no evidence of damage or roughening of the Cu surface. A similar A-B-C type ALD process on native oxide on a Si wafer surface deposited $SiO_2$.

Working Example 3—A-B-C type ALD process using PFDT as the blocking molecule, $O_3$ as the oxygen source, and di-sec-butylaminosilane (DSBAS) or 2-dimethylamino-2,4,6,8-tetramethylcyclotetrasiloxane as the Si precursors.

Figure 3:
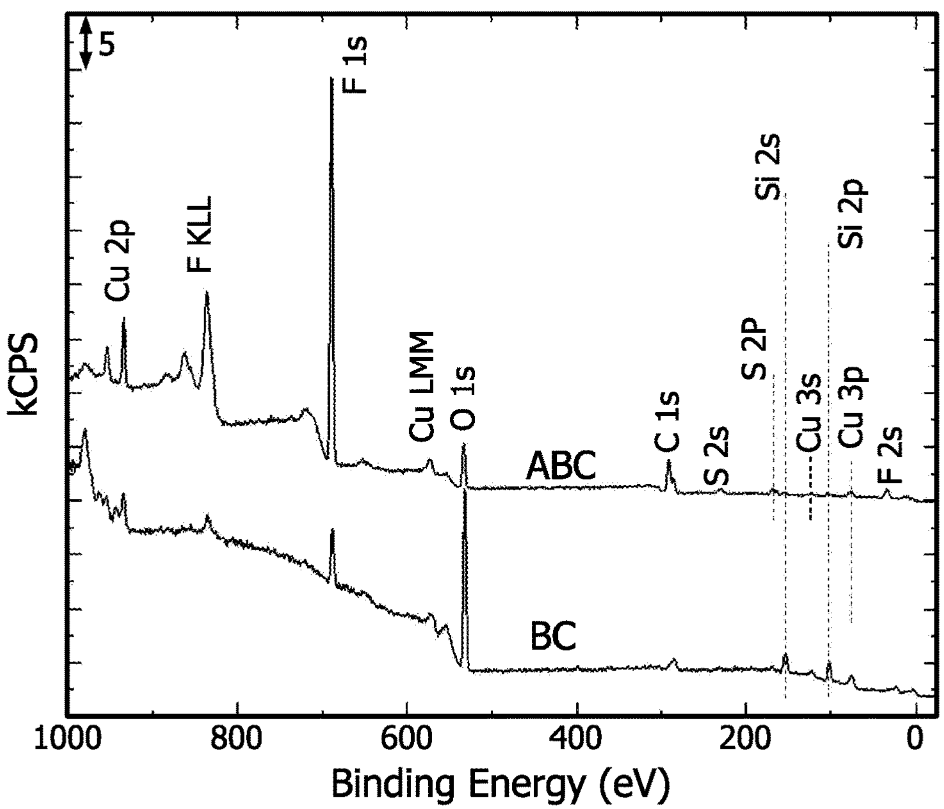
FIG. 3 shows X-ray photoelectron spectroscopy (XPS) survey and high-resolution spectra of the Si 2p region for A-B-C (with inhibitor) and B—C (without inhibitor) type ALD processes at 100° C. as described in Working Example 3, wherein A=PFDT, B=DSBAS, C=$O_3$. The PFDT inhibitor blocks silicon and oxygen containing dielectric growth on the copper surface for 30 cycles.
Figure 3:
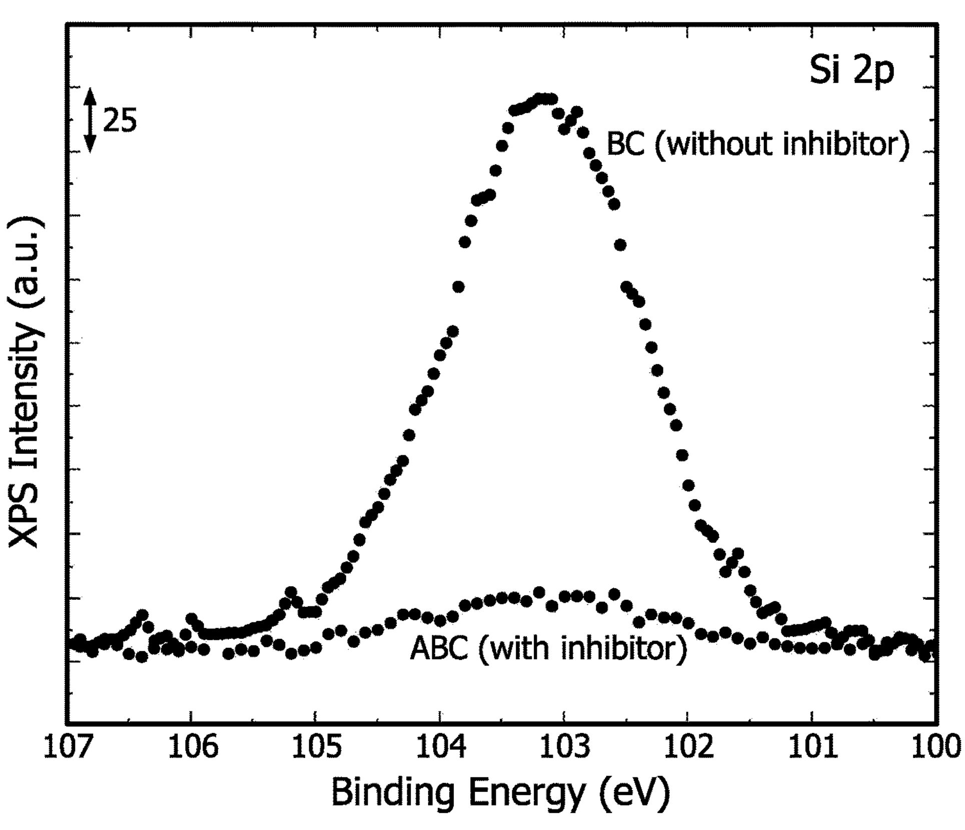

Silicon wafer substrates with electroplated copper on their surface that was planarized by CMP or with a native oxide surface was placed in a vacuum chamber evacuated to a base pressure of $5\times10^{-6}$ Ton. The substrate was heated to 100° C. and a protective layer of PFDT was selectively attached on the CMP Cu substrates via the vapor phase at a HTT pressure of 0.38 Torr (50 Pa) for 130 s followed by an Ar purge for 60 s to remove the unreacted thiol. HTT functionalized Cu substrate was exposed to DSBAS vapor at 0.035 Ton (5 Pa) for 57 s or 2-dimethylamino-2,4,6,8-tetramethylcyclotetrasiloxane vapor at 0.050 Ton (7 Pa) for 20 s followed by a 60 s Ar purge to remove any unreacted Si precursor. The substrate was then exposed to 7% $O_3$ in $O_2$ (by weight) at a total pressure of 2 Ton (267 Pa) for 30 s followed by a 30 s Ar purge step to complete one cycle of the $SiO_2$ ALD process. Steps 1 through 3 were repeated in an A-B-C type ALD (A=PFDT, B=DSBAS or 2-dimethylamino-2,4,6,8-tetramethylcyclotetrasiloxane, C═$O_3$) process up to 30 times. No evidence of $SiO_2$ deposition on the Cu surface was observed based on results from reflection-absorption infrared spectroscopy (RAIRS) and XPS. Growth selectivity was determined by comparing high-resolution XPS scans of the Si 2p region for the growth and nongrowth surfaces as shown in FIG. 3. The XPS results demonstrate that PFDT protects the surface better than HTT since is contains fewer C—H bonds. When exposed to $O_3$, HTT partly degrades forming combustion products such as $CO_2$, CO, and $H_2O$, which react with the exposed Cu surface to form carbonates. High resolution XPS scans were recorded for the Si 2p, Cu 2p, and C is regions after 45 A-B-C type ALD cycles on Cu surfaces protected with HTT and PFDT. The high-resolution XPS scan in the Si 2p region shows that both HTT and PFDT were effective in blocking ALD of $SiO_2$. However, high-resolution scans in the Cu 2p region show that PFDT is a better in preventing the oxidation of the Cu surface as the CMP Cu surface underwent almost no oxidation when PFDT was used as the inhibitor instead of HTT. This is confirmed with the high-resolution scan in the C is region, which shows a much higher degree of carbonate formation on the HTT passivated Cu surface compared to the PFDT passivated surface. Characterization of surface morphology with AFM revealed no evidence of damage or roughening of the Cu surface. A similar A-B-C type ALD process on native oxide on a Si wafer surface deposited $SiO_2$.

The above description is meant to be representative only, and thus modifications may be made to the embodiments described herein without departing from the scope of the disclosure. Thus, these modifications fall within the scope of the present disclosure and are intended to fall within the appended claims.

What is claimed is:

1. A selective thermal atomic layer deposition (ALD) process, comprising:

(a) loading a substrate comprising a dielectric material and a metal into a reactor;

(b) reacting the substrate with a non-plasma based oxidant, thereby forming an oxidized metal surface on the metal;

(c) heating the substrate to a temperature less than, or equal to, 150° C.;

(d) exposing the substrate to a passivation agent that preferentially adsorbs more onto the oxidized metal surface than the dielectric material, thereby forming a passivation layer on the oxidized metal surface;

(e) exposing the substrate to a silicon precursor that preferentially adsorbs more onto the dielectric material than the passivation layer, thereby forming a chemi-adsorbed silicon-containing layer on the dielectric material; and (f) exposing the substrate to the non-plasma based oxidant and simultaneously (1) partially oxidizing the passivation layer, thereby forming a partially oxidized passivation layer on the oxidized metal surface, and (2) oxidizing the chemi-adsorbed silicon-containing layer, thereby forming a silicon-containing dielectric film on the dielectric material; and repeating steps (e) through (f) until a thickness of the silicon-containing dielectric film formed on the dielectric material reaches the predetermined value;

wherein the non-plasma based oxidant is selected from the group consisting of hydrogen peroxide, oxygen, and ozone.

2. The selective thermal ALD process according to claim 1, wherein the dielectric material is selected from the group consisting of silicon oxide, carbon doped silicon oxide, silicon oxynitride, carbon doped oxynitride, silicon nitride, and metal oxide.

3. The selective thermal ALD process according to claim 1, wherein the metal is selected from the group consisting of cobalt, aluminum, copper, tantalum, ruthenium, molybdenum, tungsten, platinum, iridium, nickel, titanium, silver, gold, and combinations thereof.

4. The selective thermal ALD process according to claim 1, wherein step (b), the reacting the substrate with a non-plasma based oxidant, thereby forming an oxidized metal surface on the metal step, occurs at a temperature less than, or equal to, 500° C.

5. The selective thermal ALD process according to claim 4, wherein step (b), the reacting the substrate with a non-plasma based oxidant, thereby forming an oxidized metal surface on the metal step, occurs at a temperature less than, or equal to, 150° C.

6. The selective thermal ALD process according to claim 1, wherein the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol.

7. The selective thermal ALD process according to claim 1, wherein the passivation agent is selected from the group consisting of di-tert-butyl disulfide, and di-heptane disulfide.

8. The selective thermal ALD process according to claim 1, wherein the passivation agent is selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl) benzenethiol, 4-trifluoromethyl-2,3,5,6- tetrafluorothiophenol, 3,5-difluorobenzyl mercaptan, 4-trifluoromethyl-2,3,5,6-tetrafluorothiophenol, and para-trifluoromethylbenzenethiol.

9. The selective thermal ALD process according to claim 1, wherein the passivation layer comprises a monolayer of the passivation agent chemi-adsorbed to the oxidized metal surface.

10. The selective thermal ALD process according to claim 1, wherein the metal oxide is zirconium oxide, hafnium oxide, silicon doped zirconium oxide, or silicon doped hafnium oxide.

11. A selective thermal atomic layer deposition (ALD) process, comprising:

(g) loading a substrate comprising a dielectric material and metal having a native metal oxide surface into a reactor;

(h) heating the substrate to a temperature less than, or equal to, 150° C.;

(i) exposing the substrate to a passivation agent that preferentially adsorbs more onto the native metal oxide surface than the dielectric material, thereby forming a passivation layer on the native metal oxide surface;

(j) exposing the substrate to a silicon precursor that preferentially adsorbs more onto the dielectric material than the passivation layer on the native metal oxide surface, thereby forming a chemi-adsorbed silicon-containing layer on the dielectric material; and (k) exposing the substrate to a non-plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material; and repeating steps (i) through (k) until a thickness of the silicon-containing dielectric film formed on the dielectric material reaches the predetermined value;

wherein the non-plasma based oxidant is selected from the group consisting of hydrogen peroxide, oxygen, and ozone.

12. The selective thermal ALD process according to claim 11, wherein the dielectric material is selected from the group consisting of silicon oxide, carbon doped silicon oxide, silicon oxynitride, carbon doped oxynitride, silicon nitride, and metal oxide.

13. The selective thermal ALD process according to claim 11, wherein the metal is selected from the group consisting of cobalt, aluminum, copper, tantalum, ruthenium, molybdenum, tungsten, platinum, iridium, nickel, titanium, silver, gold, and combinations thereof.

14. The selective thermal ALD process according to claim 11, wherein the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol.

15. The selective thermal ALD process according to claim 11, wherein the passivation agent is selected from the group consisting of di-tert-butyl disulfide, and di-heptane disulfide.

16. The selective thermal ALD process according to claim 11, wherein the passivation agent is selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl) benzenethiol, 4-trifluoromethyl-2,3,5,6- tetrafluorothiophenol, 3,5-difluorobenzyl mercaptan, 4-trifluoromethyl-2,3,5,6-tetrafluorothiophenol, and para-trifluoromethylbenzenethiol.

17. The selective thermal ALD process according to claim 11, wherein the passivation layer comprises a monolayer of the passivation agent chemi-adsorbed to the native metal oxide surface.

18. The selective thermal ALD process according to claim 17, wherein the passivation layer further comprises a second layer of the passivation agent physi-adsorbed to the monolayer of the passivation agent chemi-adsorbed to the native metal oxide surface.

19. The selective thermal ALD process according to claim 11, wherein the silicon precursor is an organoaminomonsilane selected from the group consisting of di-iso-propylaminosilane, di-sec-butylaminosilane, bis(diethylamino)silane, bis(dimethylamino)silane, bis(ethylmethylamino)silane, bis (tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino) methylsilane, bis(diethylamino)methylsilane, bis(di-isopropylamino)methylsilane, bis(iso-propyl-sec-butylamino) methylsilane, bis(2,6-dimethylpiperidino)methylsilane, bis (iso-propylamino)methylsilane, bis(tert- butylamino) methylsilane, bis(sec-butylamino)methylsilane, bis(tert-pentylamino)methylsilane, bis(cyclohexylamino) methylsilane, bis(iso-propylamino)dimethylsilane, bis(iso-butylamino)dimethylsilane, bis(sec-butylamino) dimethylsilane, bis(tert-butylamino)dimethylsilane, bis(tert-pentylamino)dimethylsilane, bis(cyclohexylamino) dimethylsilane, and combinations thereof.

20. The selective thermal ALD process according to claim 12, wherein the metal oxide is zirconium oxide, hafnium oxide, silicon doped zirconium oxide, or silicon doped hafnium oxide.

* * * * *